(12) United States Patent
Yagi

(10) Patent No.: US 7,679,406 B2
(45) Date of Patent: Mar. 16, 2010

(54) COMPARATOR HAVING A PREAMPLIFIER WITH POWER SAVED WHILE LATCHING DATA

(75) Inventor: Katuyoshi Yagi, Kanagawa (JP)

(73) Assignee: Oki Semiconductor Co., Ltd. (JP)

( * ) Notice: Subject to any disclaimer, the term of this patent is extended or adjusted under 35 U.S.C. 154(b) by 37 days.

(21) Appl. No.: 11/945,646

(22) Filed: Nov. 27, 2007

(65) Prior Publication Data

US 2008/0143440 A1   Jun. 19, 2008

(30) Foreign Application Priority Data

Dec. 15, 2006   (JP)   ............... 2006-338680

(51) Int. Cl.
*G01C 7/00* (2006.01)
(52) U.S. Cl. .............. 327/57; 327/55; 327/65; 327/67
(58) Field of Classification Search .......... 327/53, 327/55–57, 63–67
See application file for complete search history.

(56) References Cited

U.S. PATENT DOCUMENTS 4,511,810 A * 4/1985 Yukawa ................. 327/63

6,940,316 B2 * 9/2005 Wakamatsu et al. ........... 327/57
7,372,307 B1 * 5/2008 Wu ............................. 327/96

FOREIGN PATENT DOCUMENTS

JP         05-067950         3/1993

* cited by examiner

*Primary Examiner*—Long Nguyen
(74) *Attorney, Agent, or Firm*—Studebaker & Brackett PC; Donald R. Studebaker

(57) ABSTRACT

In a comparator, a differential amplifier has a pair of transistors receiving a signal to be compared for differential amplification, and a current mirror load circuit for outputting a differential output signal in accordance with the relationship in magnitude of the signal to be compared. A latch circuit has inversion amplifiers for amplifying the differential output signal. One inversion amplifier has its input interconnected to an output of the other inversion amplifier and vice versa. The comparator still further includes a transistor for equalizing signals of the differential amplifier, a transistor for enabling the inversion amplifiers to be active, and a constant current source for reducing a current flowing from a supply voltage to the ground when the inversion amplifiers are active.

5 Claims, 3 Drawing Sheets

COMPARATOR HAVING A PREAMPLIFIER WITH POWER SAVED WHILE LATCHING DATA

BACKGROUND OF THE INVENTION

1. Field of the Invention

The present invention relates to a comparator, and more particularly to a high-speed and high-precision comparator for use in a high-speed analog-to-digital (A/D) converter or the like for comparing two small-amplitude signals with each other at a high speed to output a digital value corresponding to the relationship in magnitude of both signals.

2. Description of the Background Art

A type of comparator for use in an A/D converter or the like is known which includes an amplifier functioning as a preamplifier, and a latch circuit for outputting a digital value in synchronization with a clock signal. That sort of comparator is disclosed in, for example, Japanese patent laid-open publication No. 67950/1993 and U.S. Pat. No. 6,940,316 to Wakamatsu et al.

With reference first to FIG. 5, an example of such a conventional comparator includes a differential amplifier having N type metal-oxide semiconductor (NMOS) transistors M1 and M2 and a current mirror load circuit, and a latch circuit having two inversion amplifiers, or invertors, interconnected to the amplifier. In the differential amplifier having the current mirror load circuit, the transistors M1 and M2 have the source electrode thereof interconnected in common to a constant current source I1. The latch circuit configured by the two inversion amplifiers has an NMOS transistor M9 interconnected across output terminals OUTP and OUTN, and the transistor M9 has its gate electrode to which a clock signal CLK is applied.

In operation, when the clock signal CLK is at its high level, an input signal is not differentially amplified. When the clock signal CLK transits to its low level, the latch circuit configured by two inversion amplifiers is operated, or rendered active, a difference in voltage between the output terminals OUTP and OUTN which was small heretofore is in turn amplified by the differential amplifier having the current mirror load circuit to abruptly increase, and the voltages thus amplified is held on the output terminals OUTP and OUTN, as seen from FIG. 6.

In the above-described comparator, when the latch circuit is activated and latches data, it is not necessary to render the differential amplifier conducting current to hold the data inputted on input terminals INP and INN therein. However, the conventional comparator is adapted to operate the differential amplifier even when the latch circuit is activated. Thus, current flows from a supply voltage VDD to a ground, so that the current is consumed significantly, which has been problematic.

SUMMARY OF THE INVENTION

It is therefore an object of the present invention to provide a comparator with power consumption reduced.

In accordance with the present invention, a comparator includes a differential amplifier having a pair of transistors receiving a signal to be compared for differential amplification, and a current mirror load circuit for outputting a differential output signal in accordance with the relationship in magnitude of the signal to be compared. The comparator further includes a latch circuit having inversion amplifiers for amplifying the differential output signal. One inversion amplifier has its input interconnected to an output of the other inversion amplifier and vice versa. In the comparator, current flowing the pair of transistors is reduced after the latch circuit amplifies the differential output signal.

The comparator according to the present invention is thus adapted to shut off current flowing from a supply voltage to the ground in the current mirror load circuit while latching data, thereby overcoming the above-described problems and saving power consumption.

BRIEF DESCRIPTION OF THE DRAWINGS

The objects and features of the present invention will become more apparent from consideration of the following detailed description taken in conjunction with the accompanying drawings in which.

DESCRIPTION OF THE PREFERRED EMBODIMENTS

Figure 1:
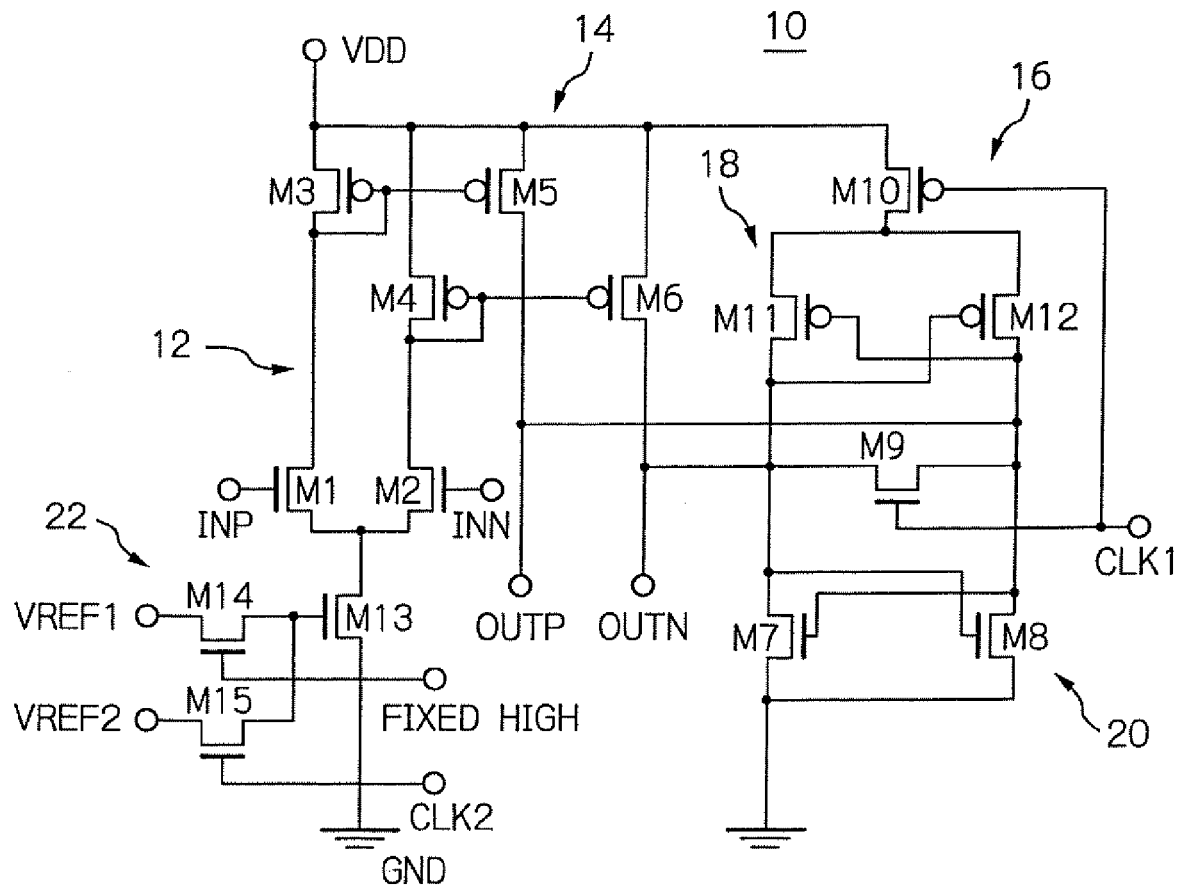
FIG. 1 is a schematic circuit diagram showing an illustrative embodiment of a comparator according to the present invention.

Preferred embodiments in accordance with the present invention will be described below with reference to the accompanying drawings. In the drawings, the size, shape and arrangement of the components and elements are merely schematically depicted to the extent that the present invention can be appreciated. In addition, like components and elements are designated with identical reference numerals and repetitive descriptions thereon will be omitted.

An illustrative embodiment of a comparator 10 according to the present invention will be described below with reference to FIG. 1 together with FIG. 2, which shows changes of clock signals inputted to the comparator 10 and the gate voltage of a transistor M13 included in the comparator 10.

The comparator 10 of the instant embodiment generally includes a differential amplifier 12 serving as a preamplifier. The differential amplifier 12 has N type metal-oxide semiconductor (NMOS) transistors M1 and M2, and a current mirror load 14 composed of P type MOS (PMOS) transistors M3, M4, M5 and M6. In addition, the comparator 10 has a latch circuit 16 configured by a couple of inversion amplifiers, or invertors, 18 and 20 that are connected so that one amplifier 18 has its input connected to the output of the other amplifier 20.

The inversion amplifiers 18 and 20 are configured by an NMOS transistor M7 and a PMOS transistor M11, and an NMOS transistor M8 and a PMOS transistor M12, respectively. In addition, the latch circuit 16 includes an NMOS transistor M9 for equalizing output signals OUTP and OUTN, and a transistor M10 for operating the inversion amplifiers 18 and 20 in synchronization with a delayed clock signal CLK1. In the following, signals are designated with reference numerals of connections on which they are conveyed.

In the differential amplifier 12 having the current mirror load 14, the transistors M1 and M2 have the source electrodes thereof interconnected to a drain electrode of the transistor M13, and the gate electrodes thereof interconnected to receive two input signals INP and INN, respectively. The transistors M1 and M2 also have the drain electrodes thereof interconnected to the drain and gate electrodes of the transistors M3 and M4, respectively, and to the gate electrodes of the transistors M5 and M6, respectively. The transistors M3, M4, M5 and M6 have the source electrodes thereof interconnected in common to a supply voltage VDD, i.e. one reference potential. The transistors M5 and M6 have the drain electrodes thereof interconnected to the respective inputs of the inversion amplifier 16 and to the output ports OUTP and OUTN, respectively.

In the latch circuit 16 configured by the two inversion amplifiers 18 and 20, the transistor M9 is connected between the output terminals OUTP and OUTN, and has its gate electrode connected to receive the clock signal CLK1 applied. The transistors M7 and M8 have the source electrode thereof grounded, i.e. connected to another reference potential GND. The transistor M7 has its gate electrode interconnected to a drain electrode of the transistor M8 and the output terminal OUTP, and the transistor M8 has its gate electrode interconnected to a drain electrode of the transistor M7 and the output terminal OUTN.

The transistor M10 has its source electrode connected to the supply voltage VDD, and its drain electrode interconnected to the source electrodes of the transistors M11 and M12. The transistors M11 and M12 have the gate electrodes thereof connected to the output terminals OUTP and OUTN, respectively, and the drain electrodes thereof connected to OUTN and OUTP, respectively.

In addition, this illustrative embodiment includes a controlled constant current source circuit 22 (hereinafter as constant current source circuit) composed of NMOS transistors M13, M14 and M15 in place of the constant current source I1 of the conventional example described earlier. In the constant current source circuit 22, the transistor M13 has its source electrode grounded. In addition, the transistor M13 has its gate electrode connected to a higher voltage source VREF1 and a lower voltage source VREF2 through the transistors M14 and M15, respectively. The transistor M14 has its gate electrode connected to receive a constant level voltage so as to operate itself as a constant resistance. The transistors M15 has its gate electrode connected to receive a clock signal CLK2, which is different from the clock signal CLK1 applied to the transistors M9.

In operation, when the clock signal CLK1 is at its high level, the transistor M9 is conductive to equalize the output signals OUTP and OUTN to substantially the same potential as each other. At the same time, the clock signal CLK1 is applied to the gate electrode of the transistors M10 to thereby be rendered non-conductive, thus the latch circuit 16 being made into its non-active state.

The two input signals INP and INN are applied to the gate electrodes of the transistors M1 and M2, respectively. However, since the transistor M9 turns on and equalizes the output terminals OUTP and OUTN to the equal potential, the input signals INP and INN would not be differentially amplified by the differential amplifier 12 having the current mirror load 14.

Next, if the clock signal CLK1 transits to its low level, the transistor M9 is made non-conductive, the differential amplifier 12 slightly amplifies a potential difference between the input signals INP and INN that are applied to the transistors M1 and M2 to be outputted to the output terminals OUTP and OUTN, respectively. In addition, the amplification operation is, although slightly, performed by the transistors M7 and M8.

At the same time, the transistor M10 is made conductive. Therefore, the latch circuit 16 is operated which is configured by the two inversion amplifiers 18 and 20 composed of the transistors M7 and M11, and M8 and M12, respectively, so that the small potential difference between the output terminals OUTP and OUTN, which is amplified by the differential amplifier 12, is rapidly enlarged to the supply voltage or the ground potential level, thus holding the potential on the output terminals OUTP and OUTN into the supply voltage VDD or the ground potential.

Subsequently, the clock signal CLK1 transits to its low level, and a little behind the clock signal CLK2 transits to its high level, thereby the transistor M15 being made conductive. In turn, to the gate electrode of the transistor M13, applied is a potential resultant from dividing a potential caused by the higher and lower voltage sources VREF1 and VREF2 by a proportion of the resistances served by the transistors M14 and M15. Therefore, the resistance of the transistors M13 is enlarged to cause a current flowing from the supply voltage VDD to the ground potential to be reduced. Reducing the current flowing from the supply voltage VDD to the ground potential causes the differential amplifier 12 to decrement in differential amplification performance. However, that has no problem because the latch circuit 16 has already latched the inputted information.

Then, the clock signal CLK2 transits to its low level. The transistor M13 is in turn made conductive again. Thus, the differential amplifier 12 conducts a current, and thus recovers its performance of differential amplification.

As described above, the comparator 10 according to the illustrative embodiment is adapted to shut off current otherwise flowing from the supply voltage VDD to the ground in the differential amplifier 12 while latching data, thus overcoming the above-described problems and saving its power consumption.

Now, with reference to FIG. 3, a comparator 30 according to an alternative embodiment of the present invention will be described together with FIG. 4. FIG. 4 shows changes of the clock signal CLK1 inputted to the comparator 30 of the alternative embodiment, the output signals of invertors INV1 and INV2 and a NAND gate NAND1, and the gate voltage of the transistor M13 shown in FIG. 3.

The comparator 30 of the alternative embodiment includes the first and second invertors INV1 and INV2, and NAND gate NAND1, in addition to the elements of the embodiment shown in and described with reference to FIG. 1. The first and second invertors INV1 and INV2 are operative in response to signals on the output terminals OUTP and OUTN, respectively, to output inverted signals to the NAND gate NAND1. The NAND gate NAND1 is adapted to output a signal to the gate electrode of the transistor M15. The remaining components may be identical with those in the embodiment shown in FIG. 1.

Figure 2:
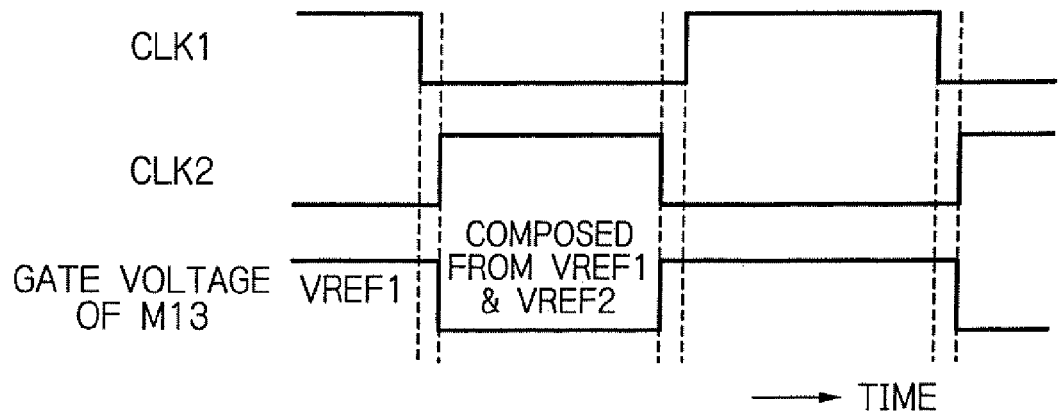
FIG. 2 is a timing chart showing changes in signals inputted to, and potential of a specific part of, the comparator of the embodiment shown in FIG. 1.
Figure 3:
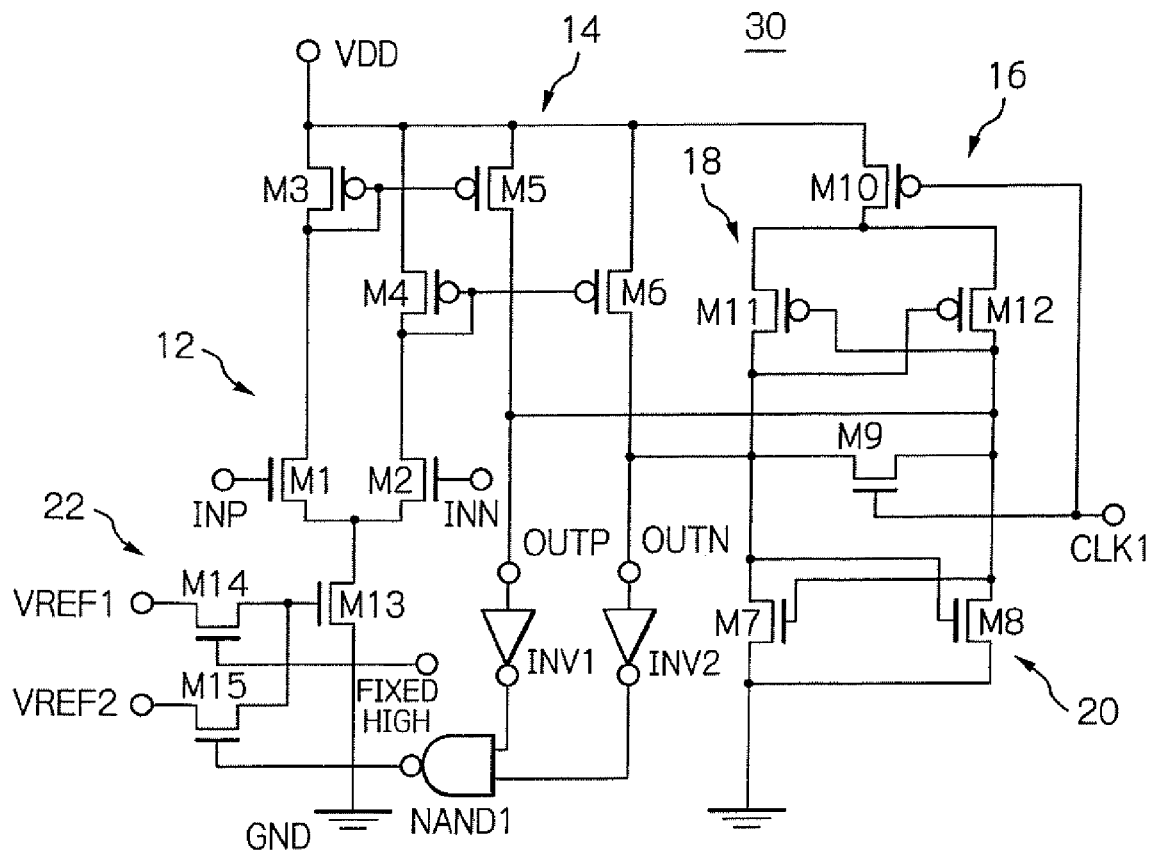
FIG. 3 is a schematic circuit diagram, similar to FIG. 1, showing an alternative embodiment of a comparator according to the present invention.
Figure 4:
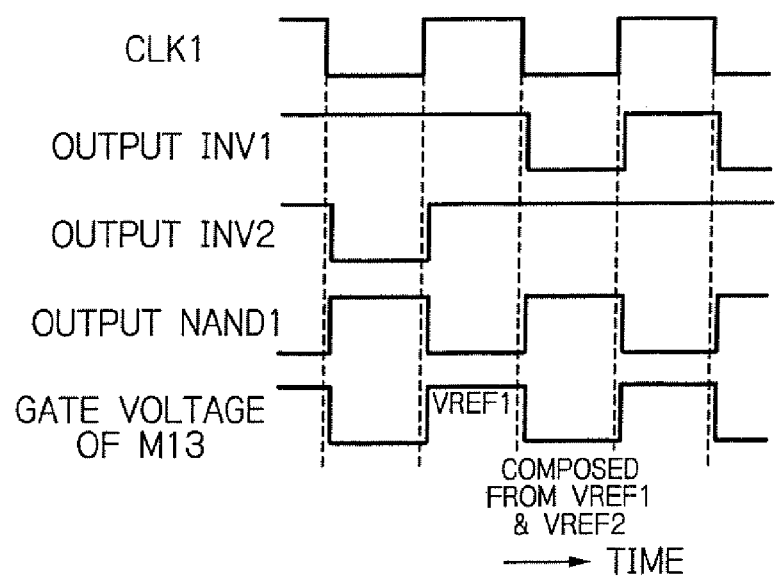
FIG. 4 is a timing chart, similar to FIG. 2, showing changes in signal inputted to, and potentials of specific parts of, the comparator of the alternative embodiment.
Figure 5:
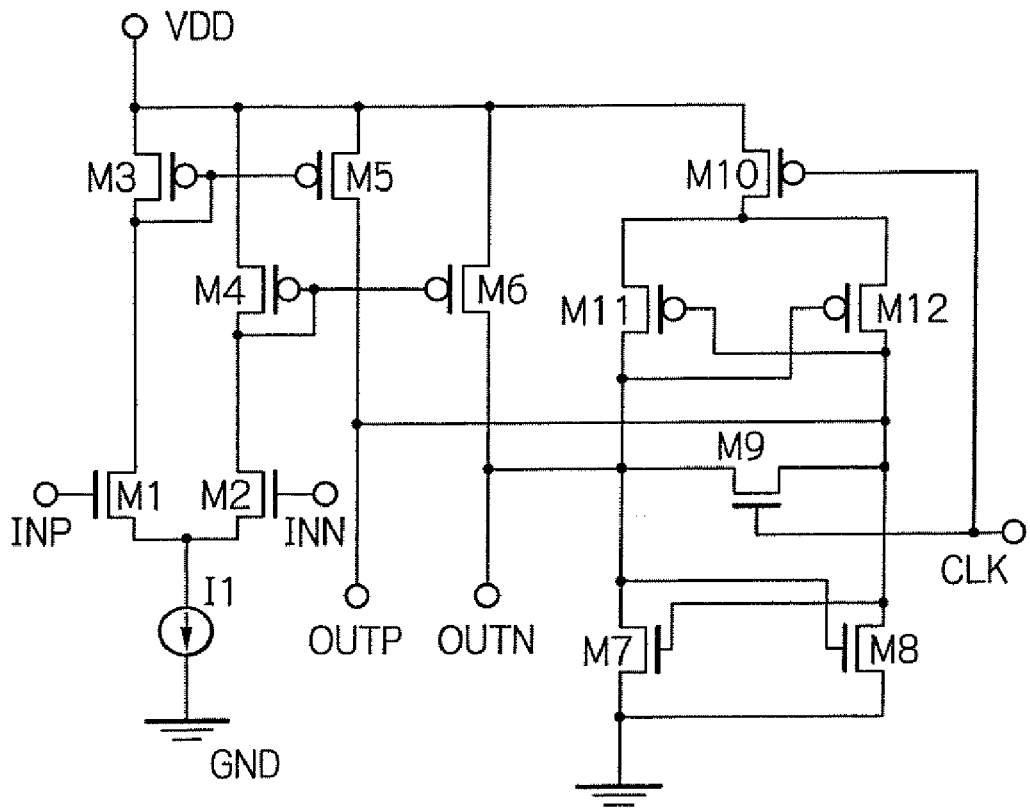
FIG. 5 is a schematic circuit diagram showing an example of conventional comparator.
Figure 6:
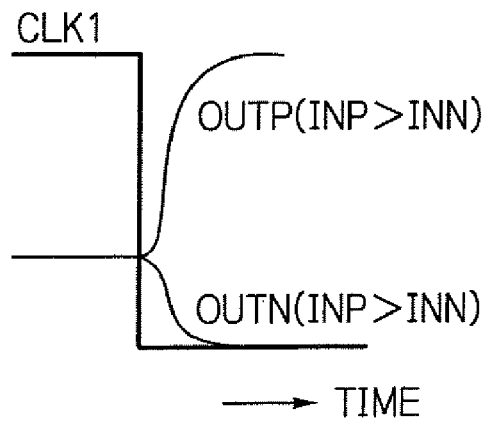
FIG. 6 shows a waveform useful for understanding the relationship between a clock signal and output signals in the conventional comparator shown in FIG. 5.

The operation of the comparator 30 shown in FIG. 3 may basically be the same as the comparator 10 shown in FIG. 1. Specifically, the comparator 30 operates not differently from the comparator 10 shown in FIG. 1 while the latch circuit 16 is not active.

Now, if the signal CLK1 transits to its low level and thus the latch circuit 16 becomes active, then the potentials of the output terminals OUTP and OUTN are complementarily held to the supply voltage VDD or the ground potential. The potentials of the output terminals OUTP and OUTN are delayed and inverted through the invertors INV1 and INV2, respectively, and inputted to the NAND gate NAND1. Because only either of the inputted signals is at its low level, the output from the NAND gate NAND1 is at its high level. That output from the NAND gate NAND1 is applied to the transistor M15, and thus the current flowing from the supply voltage VDD to the ground is reduced like the comparator 10 shown in FIG. 1.

Then, when the signal CLK1 transits to its high level to render the latch circuit 16 non-active, the potentials on the output terminals OUTP and OUTN are equalized to the equal potential, and are in turn delayed and inverted through the invertors INV1 and INV2 to be inputted to the NAND gate NAND1. Both of the inputted signals are at the high level thereof, so that the output from the NAND gate NAND1 is at its low level. The output from the NAND gate NAND1 is applied to the transistor M15, thus causing the transistor M13 to be conductive again like the comparator 10 shown in FIG. 1. Thus, a current flows along the differential amplifier 12, which thus recovers its performance of differential amplification.

As above described, the comparator 30 according to the alternative embodiment is structured to shut off a current otherwise flowing from the supply voltage VDD to the ground in the differential amplifier 12 while latching data, thereby overcoming the above-described problems and saving its power consumption.

In addition, the comparator 30 according to the alternative embodiment thus uses the invertors INV1 and INV2 and the NAND gate NAND1 so that transitions in potential on the output terminals OUTP and OUTN are delayed to be applied to the transistor M15, thereby operative with the sole clock signal CLK1.

The entire disclosure of Japanese patent application No. 2006-338680 filed on Dec. 15, 2006, including the specification, claims, accompanying drawings and abstract of the disclosure, is incorporated herein by reference in its entirety.

While the present invention has been described with reference to the particular illustrative embodiments, it is not to be restricted by the embodiments. It is to be appreciated that those skilled in the art can change or modify the embodiments without departing from the scope and spirit of the present invention.

What is claimed is:

1. A comparator comprising:
   a differential amplifier including a pair of transistors receiving a signal to be compared for differential amplification, and a current minor load circuit for outputting a differential output signal in accordance with a relationship in magnitude of the signal to be compared; and
   a latch circuit including inversion amplifiers for amplifying the differential output signal, one of said inversion amplifiers having an input interconnected to an output of another of said inversion amplifiers,
   said differential amplifier reducing, after said latch circuit amplifying the differential output signal, a current flowing through said pair of transistors.

2. The comparator in accordance with claim 1, wherein said differential amplifier is operative in response to a first clock signal, and said latch circuit is operative in response to a second clock signal different from the first clock signal,
   said differential amplifier reducing the current flowing through said pair transistors in response to the first clock signal.

3. The comparator in accordance with claim 1, wherein said differential amplifier reduces the current flowing through said pair of transistors in response to the differential output signal amplified.

4. The comparator in accordance with claim 1, wherein
   said pair of transistors are of a first conductivity type and have source electrodes interconnected in common to a controlled constant current source,
   said current minor load circuit including a first pair of second conductivity type of transistors, each of which has drain and gate electrodes interconnected to each other, the drain electrodes of said first pair of second conductivity type of transistors being interconnected to respective drain electrodes of said pair of transistors,
   said current minor load circuit further including a second pair of second conductivity type of transistors having gate electrodes interconnected to the respective gate electrodes of the first pair of second conductivity type of transistors,
   said second pair of second conductivity type of transistors having drain electrodes for outputting a differential output signal.

5. The comparator in accordance with claim 4, wherein said differential amplifier reduces the current flowing said pair of transistor in response to the comparison result signal.

* * * * *